United States Patent [19]

Sloman

[11] Patent Number: 4,614,872

[45] Date of Patent: Sep. 30, 1986

[54] CHARGED PARTICLE DEFLECTION

[75] Inventor: Anthony W. Sloman, Cambridge, England

[73] Assignee: Cambridge Instruments Limited, Cambridge, England

[21] Appl. No.: 605,831

[22] Filed: May 1, 1984

[30] Foreign Application Priority Data

May 5, 1983 [GB] United Kingdom ............... 8312291

[51] Int. Cl.⁴ ........................ G21K 1/08; H01J 3/14
[52] U.S. Cl. ........................................... 250/396 R
[58] Field of Search ............ 250/396 R, 396 ML, 398

[56] References Cited

U.S. PATENT DOCUMENTS

| 3,230,409 | 1/1966 | Farrell | 250/396 R |
| 4,169,229 | 9/1979 | Feuerbaum | 250/396 R |
| 4,335,309 | 6/1982 | Anger et al. | 250/396 R |
| 4,362,945 | 12/1982 | Riecke | 250/396 R |

FOREIGN PATENT DOCUMENTS

| 961112 | 6/1964 | United Kingdom . |
| 1188417 | 4/1970 | United Kingdom . |
| 1241018 | 7/1971 | United Kingdom . |
| 2071402 | 9/1981 | United Kingdom . |
| 2099626 | 12/1981 | United Kingdom . |

Primary Examiner—Bruce C. Anderson
Attorney, Agent, or Firm—Leydig, Voit & Mayer, Ltd.

[57] ABSTRACT

An electron beam or similar charged particles may be deflected by passing through an electrostatic field produced in a deflecting structure. The degree of deflection is controlled by rotating the deflecting structure and path relative to one another. The beam may be rotated relative to the structure by a magnetic beam deflector which compensates for a range of electron energies within the beam so that all electrons are deflected in the electrostatic field by an equal amount.

2 Claims, 5 Drawing Figures

CHARGED PARTICLE DEFLECTION

BACKGROUND OF THE INVENTION

1. Technical Field

The present invention relates to systems for deflecting electron beams or streams of other charged particles. The invention also includes a method of particle beam deflection.

2. Prior Art

In the control of monochromatic electron beams for electron microscopy or other purposes, it is usual to pass the electron beam through a fixed spatial arrangement of deflecting plates across which a variable electrostatic field is produced in dependence on the degree of deflection required. Therefore such systems require the provision of means for producing electrostatic fields of variable magnitude. It will also be appreciated that the degree of deflection of the beam will depend on the amount of time spent by the individual particles between the plates. In present systems this time depends solely on the velocity of the particles being deflected, which is related to their energy.

In one application of an electron microscope to study the performance of a working integrated circuit chip it is required to "illuminate" the chip with the electron beam in a stroboscopic manner. Thus the chip is observed at times separated by a time period equal to the operating cycle time of the circuit, and the circuit is always in the same electrical state. The electron beam is said to be "blanked" in between observations. To achieve this blanking the beam is rapidly deflected away from the chip by applying an electric field to deflecting plates surrounding its path.

Particular difficulties are experienced with the present systems when it is desired to make provision in the same structure for the rapid deflection of either a beam of high velocity particles or a beam of low velocity particles. A set of plates sufficiently long to provide adequate deflection for a high velocity beam will be traversed so slowly by a beam of low velocity particles that the transition between the blanked and unblanked conditions will be unacceptably slow, and, moreover, it is necessary to change the voltage applied to the plates for deflecting low velocity particles in order to prevent the particles striking the plates and so impairing the future performance of the system.

SUMMARY OF THE INVENTION

Accordingly the present invention provides a system for deflecting energetic charged particles, including a deflecting structure through which charged particles travel along a path, means for generating an electrostatic field therein which field influences particles travelling said path within said deflecting structure, and means for moving the deflecting structure and the path of the charged particles relative to one another in order to vary the length of said path during which the particles are under the influence of said electrostatic field and, accordingly, the degree of deflection of said charged particles.

This system is advantageous in that the electrostatic field applied to the deflecting structure can be kept constant if desired. The deflecting structure may be used to deflect a charged particle beam by a constant angle over a considerable range of beam energy while employing a constant intensity of deflection field. This considerably simplifies the design of the means by which the electrostatic field is generated, e.g. high speed pulse drives. The system is particularly useful if an electron beam is to be blanked, i.e. the point at which the electrons fall on an object plane is to be moved a predetermined distance laterally, in a time shorter than that for which the particle is traversing the deflecting structure.

The relative movement can be produced in a variety of ways. In one preferred method means are provided for rotating the deflecting structure comprising a pair of substantially parallel elongate deflecting members about an axis substantially perpendicular to both the path of the charged particles and the length of the members.

In another preferred embodiment a magnetic field is provided to deflect the beam into a path inclined relative to the original path. With such an arrangement it is possible to avoid the use of all moving parts in the system.

The system of the present invention is particularly suitable for use with a deflecting structure of the travelling wave type. Structures of the travelling wave type are described in a paper entitled "Beam Chopper for subnanosecond pulses in scanning electron microscopy" by H. Feuerbaum & J. Otto in J. Phys. E: Scientific Instruments, Volume Eleven, pages 529–532 (1978). when such a deflecting structure is used the relative movement required is customarily translation rather than rotation. A magnetic field device may be used for producing the necessary relative movement in order to spatially separate particles of different velocities. In this way the travelling wave structure can be used to provide constant deflection of charged particles having a range of velocities.

The invention also provides apparatus for repeatedly blanking an electron beam for use in an electron microscope, said apparatus including a deflecting structure through which the electron beam travels, means for repeatedly producing an electrostatic field in said structure to deflect electrons within said structure to blank said beam, and means for moving the deflecting structure and the beam path relative to one another in order to blank beams of varying energy.

DESCRIPTION OF PREFERRED EMBODIMENTS

The systems to be described are suitable for use in various types of apparatus where it is required to deflect a beam of high energy charged particles by means of an electrostatic field. A typical application is to rapidly "blank" an electron beam in electron microscopy but the invention is not limited to this application. Moreover, although the following description refers to beams of electrons, it will be appreciated that beams of other charged particles may be employed similarly. Although in many applications the electrons or other charged particles will be produced in a continuous beam, the system may be employed to deflect particles arriving intermittently.

Figure 1:
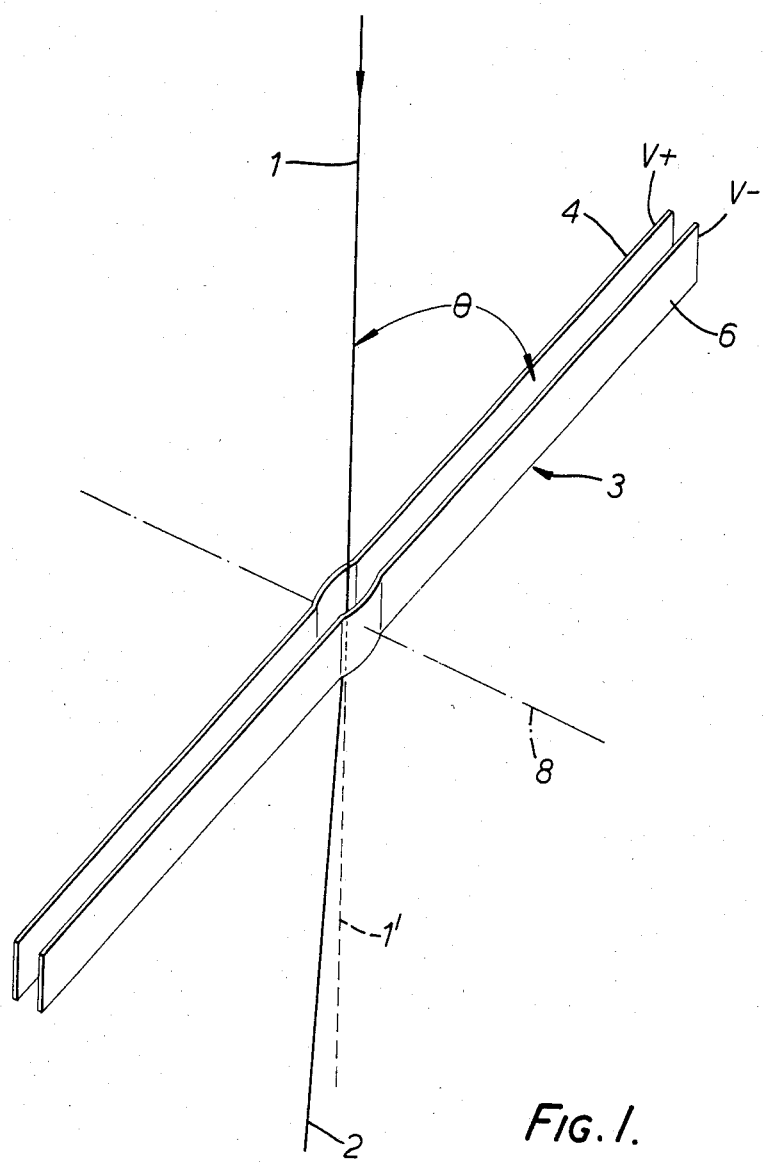
FIG. 1 shows a first type of system in which a pair of deflecting plates are rotatable.

With reference to FIG. 1 an electron beam 1 generated by a source (not shown) follows a path which passes through a deflecting structure 2 by means of which the electrons are deflected so that the exit path 2 of the beam is at an angle to the original path 11 (shown dotted). In this case the deflecting structure 3 consists of two substantially parallel elongate deflecting plates 4, 6. Parallel wires could also be used in place of the plates 4, 6. An electrostatic field is produced between the plates by the use of a field generator such as a high speed pulse driver (not shown), in the case where the electron beam is to be rapidly and repeatedly blanked. Typically the voltage applied to the plates is ±7 volts. As illustrated the plates are shaped to define a "keyhole" portion at their centre. This is to reduce the electric field in this region. The same effect may be achieved by disposing grounded plates above and below the central portion.

The deflecting plates 4, 6 are mounted so that they can be rotated together about an axis 8 which is perpendicular to both the original path 1 of the electron beam and the length of the plates. The drive allows the angle $\theta$, which is the angle between the original path of the beam and the direction of extension 20 of the deflecting plates, to be varied between 0° and 90°. When $\theta$ equals 0° then the deflecting plates 4, 6 are aligned parallel to the undeflected electron beam path 1. In this orientation the electrons are subjected to the effect of the electrostatic field for the maximum amount of time and therefore the degree of deflection produced is greatest for a constant applied electrostatic field. When $\theta$ equals 90° the length of the path of the electron between the deflecting plates is equal to the width of the deflecting plates and, accordingly, the degree of deflection is at a minimum for a constant applied electrostatic field. Thus with a constant applied electrostatic field between the deflecting plates 4, 6 a significant variation in the degree of beam deflection achieved can be produced by selecting the appropriate angle of $\theta$.

Figure 2:
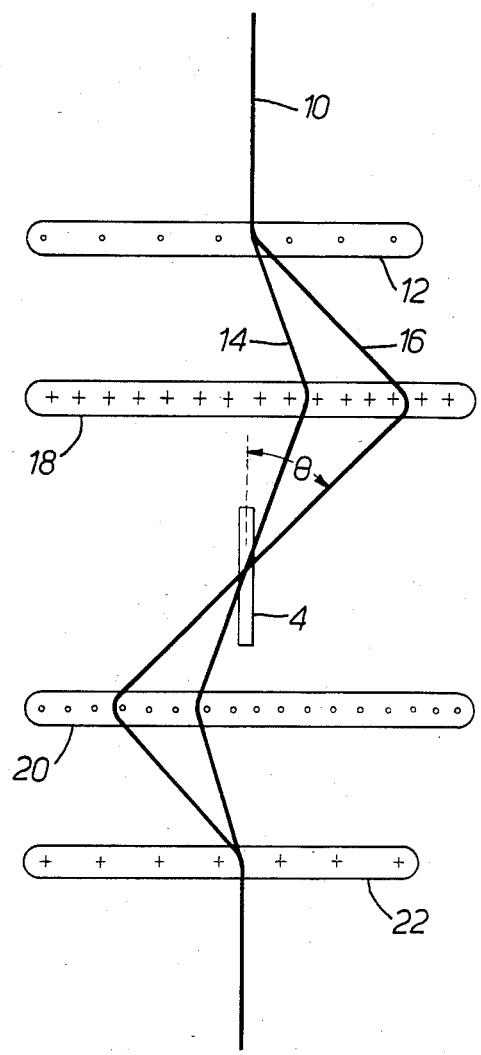
FIG. 2 shows a magnetic beam deflector for use in a system in which the particle path is rotated relative to the deflecting structure.

In the embodiment of FIG. 1 the deflecting structure 3 is rotated relative to the path 1 of the beam. However it is also possible to rotate the beam path relative to the deflecting structure. FIG. 2 shows a magnetic beam deflector suitable for this purpose. In this Figure the plate 4 of the deflecting structure is shown below the beam path (that is, below the plane of the paper), the other (not shown) being above it (that is above the plane of the paper), so that the plates operate to deflect the beam in a plane perpendicular to the paper. In FIG. 2 a region 12 of elongate oval cross-section of magnetic field directed inwardly perpendicular to the paper is produced by a magnetic field generator shown and described in more detail with reference to FIG. 3, effects the electron beam over a short length of the path 10. The magnetic field produced in region 12 may, for example, be +0.05 Tesla directed into the paper. As the beam passes through this field it is deflected by an amount which depends on the particle velocity or, equivalently, of the beam energy. Thus a low energy beam takes a path 16 while a higher energy beam will take a path 14. The electron beam then passes perpendicular to a magnetic field produced in a further region 18. In region 18 a larger magnetic field of the opposite polarity of, for example, −0.1 Tesla is produced, which, accordingly, deflects the beam into an oppositely inclined path. As the beam leaves this second region 18 it is inclined at an angle $\theta$ to its original path 10. This angle $\theta$ corresponds to the angle $\theta$ illustrated in FIG. 1 and indicates the angle between the beam and the deflecting plates. In this embodiment the deflecting plates are fixed parallel to the original path 10. As the beam passes through the deflecting structure it is deflected in a plane perpendicular to the paper. The beam is then passed through two further magnetic field regions 20, 22 which produce magnetic fields of equal magnitude but opposite polarity to the regions 18 and 12 respectively. This restores the beam to its original orientation in the plane of the paper so that the net deflection of the beam is only that causes by the deflecting structure.

Figure 3:
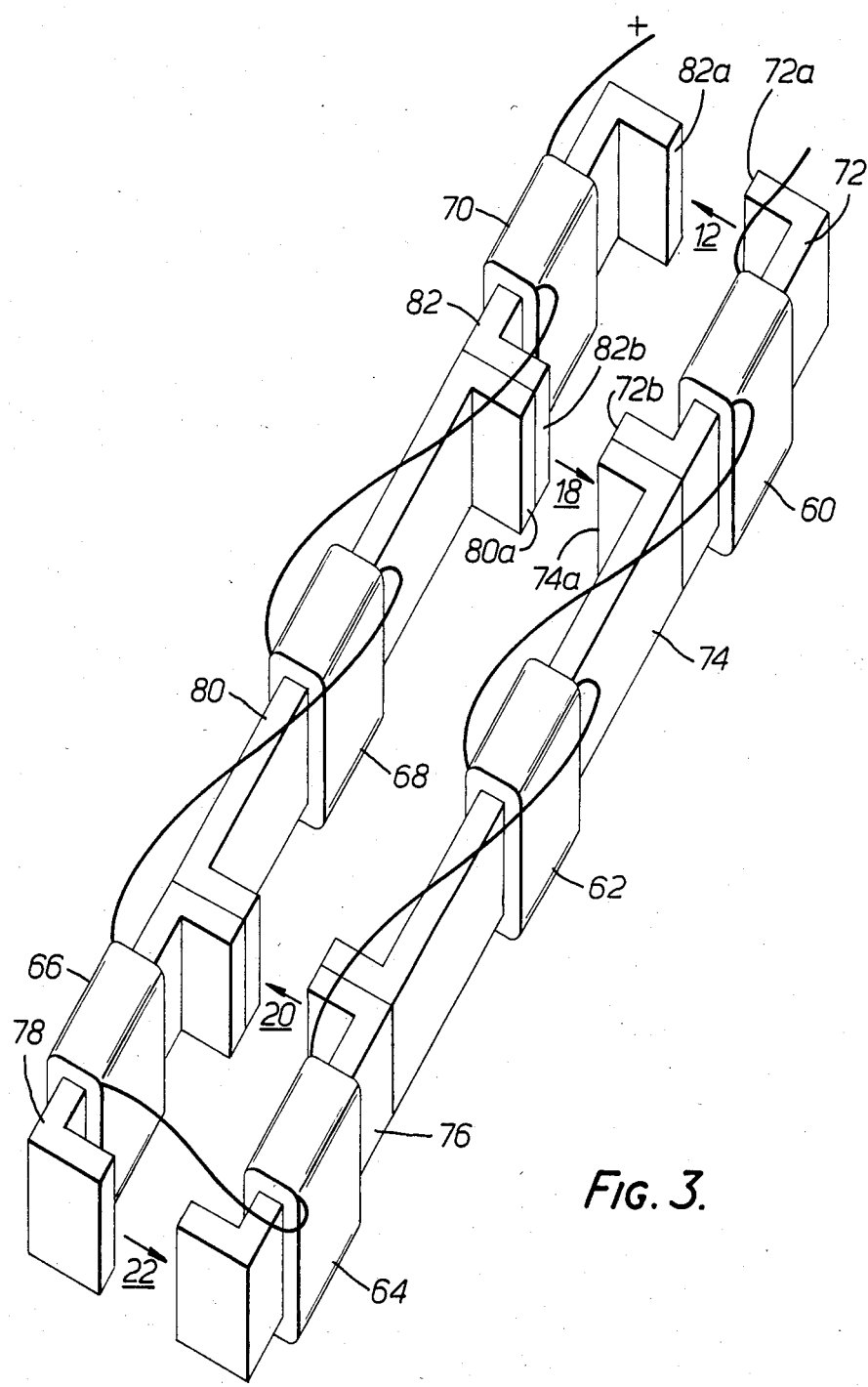
FIG. 3 shows a perspective view of magnetic field generating means for use in the magnetic beam deflector of FIG. 2.

FIG. 3 shows in more detail a magnetic field generating means which may be used to produce a magnetic field having the regions 12, 18, 20 and 22 required for the deflector of FIG. 2. Serially connected coils 62, 64, 66, 68 and 70 each having the same number of turns are wound on respective U-shaped iron or soft ferrite pole pieces 72, 74, 76, 78, 80 and 82. The pole pieces are of high magnetic permeability in order to define the necessary flux path. The magnetic field region 12 is produced between the opposing faces 72a and 82a of pole pieces 72 and 82 respectively. The larger magnetic field of region 18 is produced between the two pairs of opposing faces 72b, 74a and 82b, 80a. Regions 20 and 22 are produced similarly. In FIG. 3 the defecting plates 4 and 6 are not shown for reasons of clarity, but it will be appreciated that they are disposed approximately between the two coils 62 and 68.

The spacings between the opposing faces of the pole pieces has been shown greatly exaggerated for reasons of clarity.

If it is desired to produce a constant deflection independent of the particle energy then the arrangement of FIG. 2 is particularly suitable because constant currents may be employed in the coils 60 to 70 to produce uniform constant magnetic fields together with a constant electrostatic field between the deflecting plates. The action of the magnetic field will ensure that $\theta$ is appropriately varied in dependence on the energy of each particle to produce the necessary path length between the deflecting plates to give the required constant deflection. Thus a high energy beam is deflected relatively little in the regions 12, 18 so that $\theta$ remains small and the path length of the particle within the deflecting structure is relatively long. A low energy beam is deflected by the magnetic fields so that $\theta$ is closer to 90° and the path length within the deflecting structure is correspondingly shortened. Both high and low energy particles spend a sufficient time within the deflecting structure in order to be deflected by the same amount.

Figure 4:
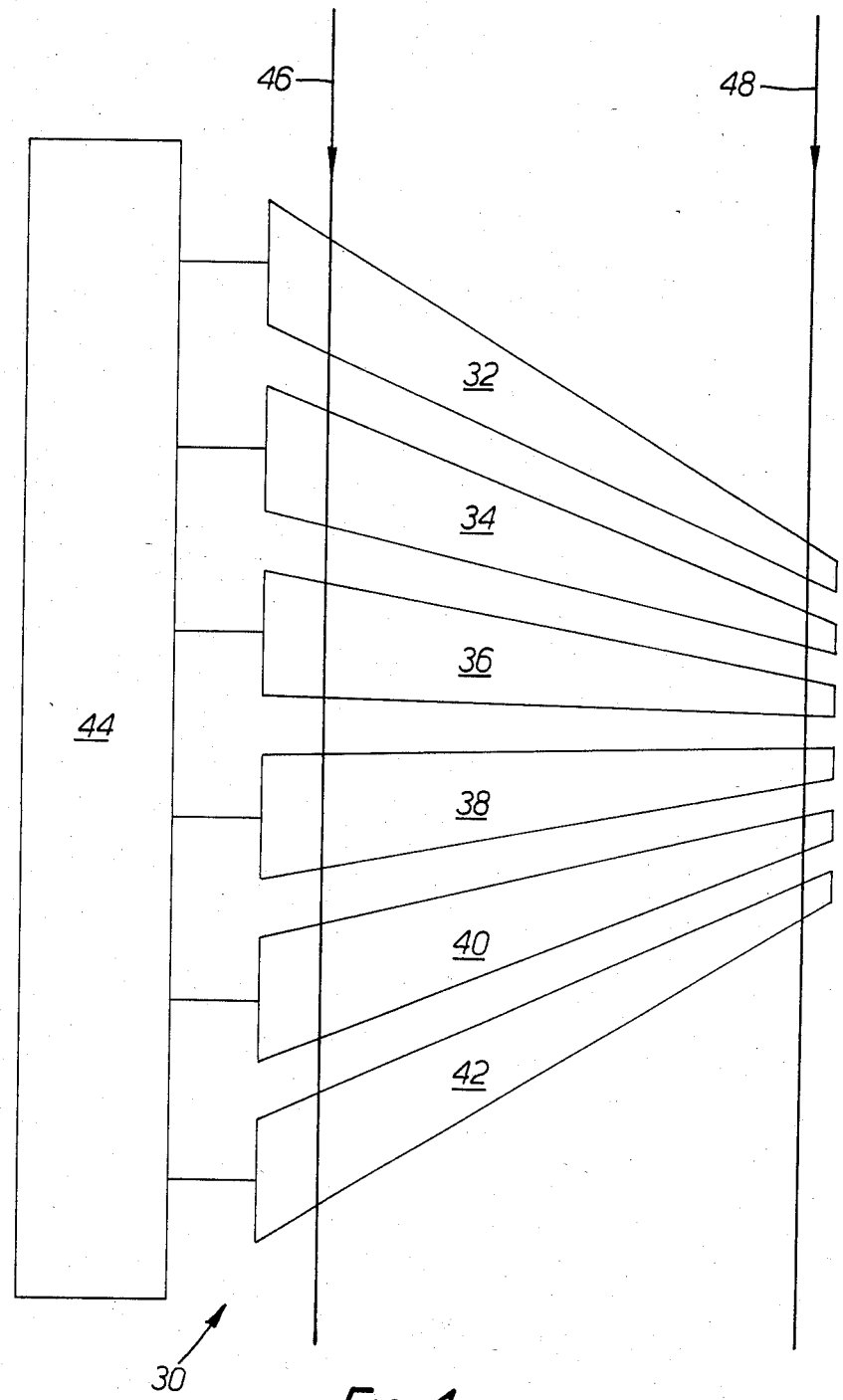
FIG. 4 shows a system using a travelling wave type deflecting structure.
Figure 5:
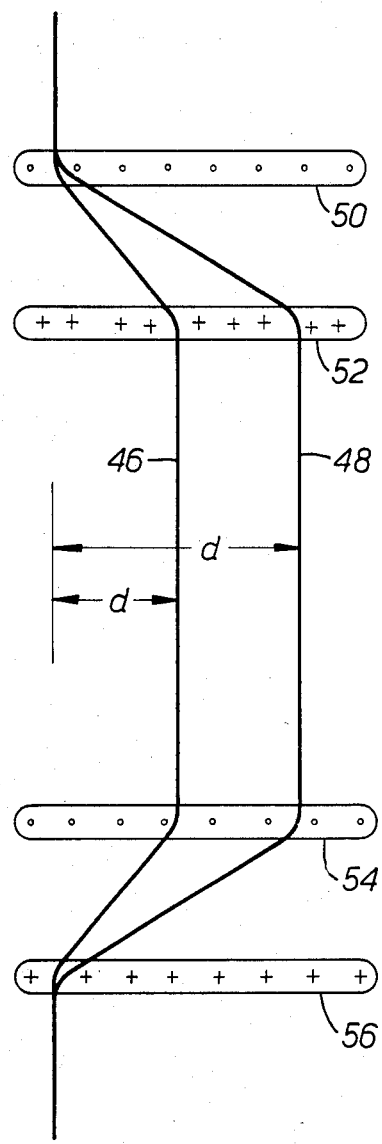
FIG. 5 shows a magnetic beam-deflector for use with the deflecting structure of FIG. 4.

The embodiment illustrated in FIGS. 4 and 5 utilizes a travelling wave structure 30 as its deflecting structure. The travelling wave structure 30 includes a number of parallel pairs of elements, one of each pair 32, 34, 36, 38, 40, 42, is connected at a spaced point along a tapped delay line 44. The other element (not visible in the Figure) of each pair is earthed. The elements are designed and connected such that an electromagnetic wave propagating within the structure manifests itself at a straight line across the structure corresponding, for example, to an electron beam path 46 or 48, as an electrostatic wave propagating along the path at a velocity which is chosen to correspond to the velocity of the electrons traversing the structure along that path.

Under these conditions a beam traversing the surface along such a straight line path may be deflected as a whole in a time shorter than that required for the individual charged particles to traverse the deflecting structure. Thus the arrangement is particularly useful for producing rapid beam blanking in electron microscopes.

The elements 32-42 of the deflecting structure are designed such that there will be a multiplicity of possible parallel straight line paths across the structure, each matched to a different beam velocity, so that the structure may be appropriately translated relative to the beam path in the plane of the paper to a position matched to the particular beam velocity. The structure is therefore capable of blanking the electron beam by laterally displacing it in a time shorter than that required for an individual charged particle to traverse the deflecting structure. For example, the path 46 is suitable for a high velocity beam, whereas path 48 is suitable for a low velocity beam. Such a structure can provide rapid beam deflection over a relatively wide range of beam velocities.

The travelling wave structure 30 can be translated by a suitable drive (not shown) to displace it into a correct position for a desired degree of deflection. The drive displaces the paired elements together in a plane parallel to the beam path and the planes of the elements.

As an alternative to displacing the structure 30, the beam path can be displaced by a magnetic deflector such as that illustrated in FIG. 5.

A magnetic deflector such as that illustrated in FIG. 5 can be used to deflect electrons of differing velocities into appropriate paths through the structure to produce a desired constant deflection independently of individual particle energy. The deflector of Figure 5 works on the same principle as that of FIG. 2. Regions 50 and 52 are provided in which magnetic fields of equal magnitude but opposite polarity are produced by a magnetic field generator (not shown). For example, the magnitude may be set at 0.1 Tesla. This displaces the path by a distance d into a parallel position. The distance d decreases with increasing beam velocity as required by the design of the travelling wave structure. The fields produced in regions 54 and 56 are equal and opposite to those at regions 52 and 50 respectively and restore the electrons to their original path so that the net deflection is that caused by their passage through the travelling wave structure. The magnetic field generator used to produce a magnetic field having the regions 50, 52, 54 and 56 may be similar to that illustrated in FIG. 3. In this case, however, the central pole pieces 74 and 80 and their associated coils 62 and 68 are omitted It will be appreciated that by using magnetic beam deflectors the deflecting systems described may be made self-compensating over a limited range of beam velocities. As well as the magnetic systems described to achieve this effect, electrostatic fields may be employed.

In order to move the beam path and deflecting structure relative to one another it is also possible to displace the beam-forming elements appropriately.

The various systems described above enable energetic charged particles to be deflected, without the need for varying the deflecting electrostatic field, by moving the beam path and deflecting structure relative to one another. Such systems may also be designed to deflect by a constant amount particles of varying energy.

I claim:

1. A system for deflecting energetic charged particles comprising:

a travelling wave deflecting structure including a plurality of pairs of elongate plate elements, one said plate element of each pair being in a first plane and the other said plate element of each pair being in a second plane parallel to said first plane, a delay line, power supply means for applying a signal to said delay line, one plate element of each pair being connected to a respective point on said delay line, the other plate element of each said pair being earthed, the plurality of elements tapering in a longitudinal direction and the shaping of said elements and the points at which said elements are connected to said delay line being such that electrostatic waves propagate between said planes, the velocity of an electrostatic wave in a straight line traversing all of the pairs of plate elements varying in dependence on the position of the straight line in the longitudinal direction of the plate elements whereby a charged particle which travels in any said straight line path between said planes at the same velocity as the wave propagating in that straight line is deflected in a blanking manner perpendicular to said planes, and magnetic deflecting means for deflecting a particle beam containing particles of different energies so that each particle follows a straight line path through the said deflecting structure along which straight line path an electrostatic wave propagates with a velocity substantially equal to the particle velocity whereby the path lengths of particles of different energies travelling between said plate elements varies and that each particle is deflected by a constant amount by said deflecting structure.

2. A system for deflecting energetic charged particles, comprising a deflecting structure including:

a pair of substantially parallel elongate deflecting members defined in respective first and second parallel planes, between which members charged particles travel along a path, means for generating an electrostatic field between said members, which field influences particles travelling said path within said deflecting structure, and means for rotating the deflecting structure and the path of the charged particles relative to one another such that the structure remains in the same said planes and for varying the length of said path during which the particles are under the influence of said electrostatic field and, accordingly, the degree of deflection of said charged particles.

* * * * *